United States Patent [19]

Barnhart

[11] Patent Number: 4,646,127
[45] Date of Patent: Feb. 24, 1987

[54] SCRAP-LESS TAPING SYSTEM FOR IC LEAD-FRAMES

[75] Inventor: Robert V. Barnhart, York, Pa.

[73] Assignee: GTE Products Corporation, Stamford, Conn.

[21] Appl. No.: 831,890

[22] Filed: Feb. 24, 1986

Related U.S. Application Data

[62] Division of Ser. No. 772,231, Sep. 3, 1985, Pat. No. 4,597,816.

[51] Int. Cl.⁴ ............................................. H01L 23/48
[52] U.S. Cl. ........................................ 357/70; 428/77
[58] Field of Search ............................ 357/70; 29/827; 156/263, 270, 301, 269; 428/77

[56] References Cited

U.S. PATENT DOCUMENTS 4,480,150 10/1984 Jones et al. ....................... 29/827 X Primary Examiner—Alexander S. Thomas
Attorney, Agent, or Firm—William H. McNeill

[57] ABSTRACT

A scrap-less taping system for IC lead-frames includes two tape supplies fed to a web of formed lead-frames. Right-angled segments of tape are cut from the strip of tape and applied to two adjacent sides of the leads of the lead-frames.

2 Claims, 3 Drawing Figures

SCRAP-LESS TAPING SYSTEM FOR IC LEAD-FRAMES

This is a divisional of co-pending application Ser. No. 772,231 filed on Sept. 3, 1985, now U.S. Pat. No. 4,597,816.

TECHNICAL FIELD

This invention relates to the manufacture of integrated circuit (IC) lead-frames and more particularly to a taping system employed in the manufacture of such lead-frames. Still more particularly, the invention relates to a scrap-less taping system.

BACKGROUND ART

IC lead-frames are multi-connector units usually formed by stamping processes utilizing a continuous web of material. The various connector elements usually remain attached to the parent web until the connector elements are mounted and fixed into an electrically insulating housing.

Because the connector elements are quite fragile and are usually connected to the parent web at only one of their ends, it is not an uncommon practice to employ a taping procedure whereby small, rectangular pieces of tape are applied to the lead-frame adjacent to the loose ends of the connectors.

One basic method of achieving the taping involves feeding a strip of tape from a supply thereof to an appropriate position over a lead-frame and cuttin a rectangular strip from the center of the tape and applying it to the lead-frame. This method provides a great deal of scrap which must be taken up by another spool.

Another method, which is scrap-less, removes a segment of tape that is the full width of the strip; however, in order to tape a lead-frame on four sides; i.e., where the tape segments form a hollow rectangular or square, four tape supplies are needed: a system which is quite complicated and expensive.

DISCLOSURE OF THE INVENTION

It is, therefore, an object of the invention to obviate the disadvantages of the prior art.

It is another object of the invention to enhance the taping of the lead-frames.

Yet another object of the invention is the provision of a scrap-less taping system that is simple and inexpensive to use.

These objects are accomplished, in one aspect of the invention, in a system wherein the leads of integrated circuit lead-frames are formed as units on a continuous web of material, the material being intermittantly fed in a given direction of movement through a plurality of work stations. A first strip of tape is fed from a first supply thereof to a first work station. A first right angled segment is removed from the first strip and applied to two adjacent sides of a lead-frame. A second strip of tape from a second supply is fed to a second work station where a second right-angled segment is removed and applied to the two adjacent sides of the lead-frame opposite the sides secured by the first segment.

This procedure effectively secures all four sides of the lead-frame, yet employs only two tape supplies and feeds. The system is scrapless and is much more economical than previous systems.

BEST MODE FOR CARRYING OUT THE INVENTION

For a better understanding of the present invention, together with other and further objects, advantages and capabilities thereof, references is made to the following disclosure and appended claims taken in conjunction with the above-described drawings.

Figure 1:
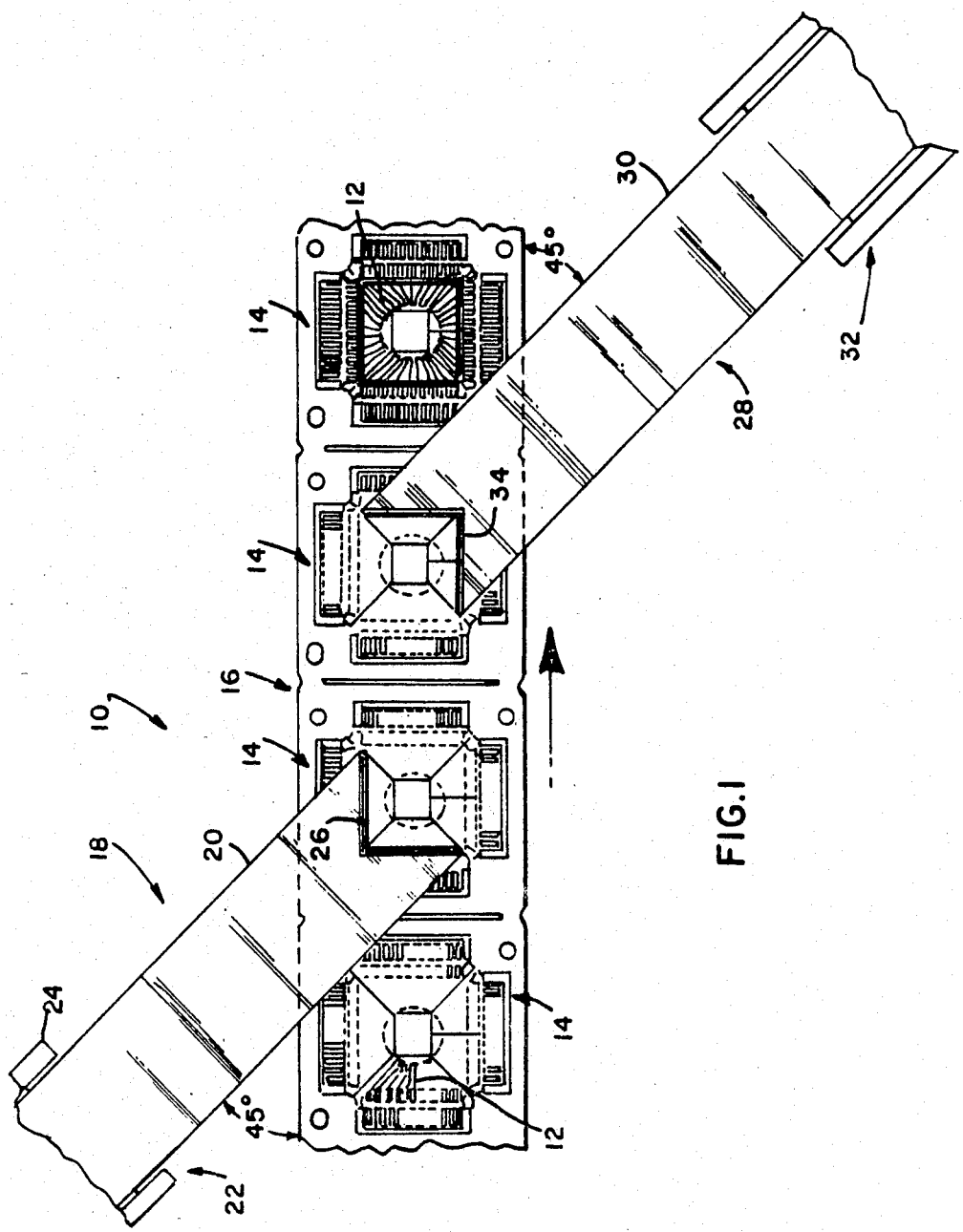
FIG. 1 is a diagrammatic plan view of an embodiment of the invention.

Referring now to the drawings with greater particularity, there is shown in FIG. 1 a scrap-less taping system 10 for taping the leads 12 of IC lead-frames 14 formed as units on a continuous web of material 16. Material 16 can be any suitable electrically conductive material formed by stamping; photo-chemical etching; or other processes.

The web material 16 is fed in a given direction of movement, e.g., the direction indicated by the arrow in FIG. 1, by means not shown, through a plurality of work stations.

At a first work station 18 a first strip of tape 20 is fed from a supply 22 thereof, e.g., a spool 24, to a position above a lead-frame 14 and a first right-angled segment 26 is cut therefrom and applied to two adjacent sides of the lead-frame, thus securing the loose ends of the leads.

At a second work station 28, which can be next in line in the direction of travel of web material 16, a second strip of tape 30 is fed from a supply 32 thereof, to a position above the lead-frame 14 previously worked upon, and a second right-angled segment 34 is cut therefrom and applied to the to remaining adjacent sides of lead-frame 14 which are opposite to the sides secured by the first segment 26.

This simple process secures all of the loose lead ends and holds them in a planar fashion which greatly enhances subsequent operations to be performed on the lead frames. All four sides of the lead frames are taped using only two work stations and, except for the start up operation, the system produces no tape scrap.

In a preferred form of the system 10 the two tape supplies, 22 and 32 respectively, are positioned on opposite sides of material 16, transverse to the direction and are fed to material 16 at an angle of other than 90°, with 45° being preferred.

Figure 2:
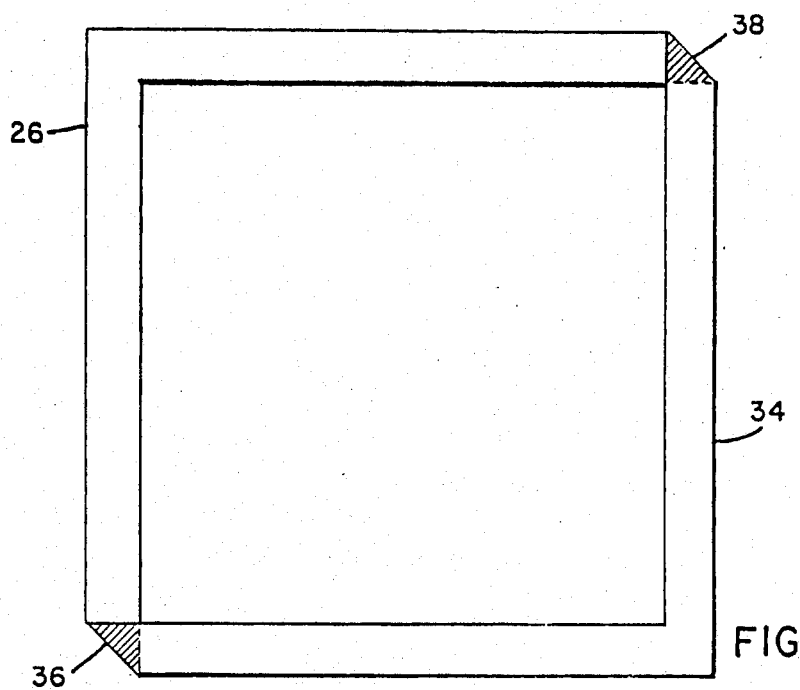
FIG. 2 is a plan view of the taping arrangement in an embodiment of the invention.

An englarged view of the tape application is shown in FIG. 2, wherein it is seen that the first and second segments (26, 34) overlap at only two opposite corners 36 and 38 (shown by shade lines in FIG. 2.)

Figure 3:
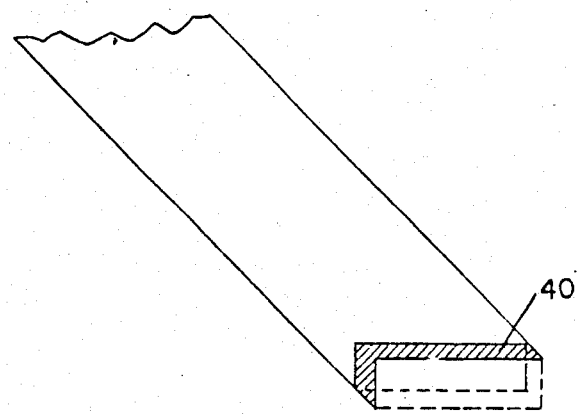
FIG. 3 is a plan view of an alternate embodiment.

While the lead-frames 14 shown in FIGS. 1 and 2 present a substantially square format, the invention is not limited thereto. As shown in FIG. 3 a right-angled segment 40 of rectangular configuration can also be provided by this scrap-less taping system.

While there have been shown and described what are at present considered to be the preferred embodiments of the invention, it will be apparent to those skilled in the art that various changes and modifications can be made herein without departing from the scope of the invention as defined by the appended claims.

I claim:

1. An integrated circuit lead-frame comprising a plurality of adjacent lead-in connectors extending from four directions inwardly toward a center, said lead-in connectors being maintained in a substantially planar fashion by means of a first right angled segment of tape being applied to two adjacent portions of said lead-in connectors and a second right angled segment of tape being applied to the two adjacent portions of said lead-in connectors opposite to the portions secured by said first segment.

2. The lead-frame of claim 1 wherein said first and second segments overlap at only two opposite corners.

* * * * *